United States Patent [19]

Lin

[11] Patent Number: 4,672,421
[45] Date of Patent: Jun. 9, 1987

[54] SEMICONDUCTOR PACKAGING AND METHOD

[75] Inventor: Paul T. Lin, Austin, Tex.

[73] Assignee: Motorola, Inc., Schaumburg, Ill.

[21] Appl. No.: 865,572

[22] Filed: May 15, 1986

Related U.S. Application Data

[63] Continuation-in-part of Ser. No. 595,863, Apr. 2, 1984, abandoned.

[51] Int. Cl.[4] .......................................... H01L 39/02
[52] U.S. Cl. ........................................ 357/80; 357/74; 361/402; 361/411
[58] Field of Search ............... 174/52 FP, 52 PE; 357/74, 80; 361/397, 400, 402, 411

[56] References Cited

U.S. PATENT DOCUMENTS

| | | | |
|---|---|---|---|
| 3,927,815 | 12/1975 | Mase et al. | 357/74 |
| 4,092,614 | 5/1978 | Sakuma et al. | 357/81 |
| 4,122,479 | 10/1978 | Sugawara et al. | 357/75 |
| 4,143,385 | 3/1979 | Miyoshi et al. | 357/75 |
| 4,153,988 | 5/1979 | Doo | 361/401 |
| 4,288,841 | 9/1981 | Gogal | 174/52 FP |
| 4,352,120 | 9/1982 | Kurihara et al. | 357/80 X |
| 4,450,472 | 5/1984 | Tuckerman et al. | 357/82 |
| 4,517,403 | 5/1985 | Morel et al. | 357/30 |
| 4,549,200 | 10/1985 | Ecker et al. | 361/397 |
| 4,571,610 | 2/1986 | Matsushita et al. | 357/80 X |

FOREIGN PATENT DOCUMENTS

0161681 12/1981 Japan ..................................... 357/19

OTHER PUBLICATIONS

*IBM Technical Disclosure Bulletin*, "Active Silicon Chip Carrier," D. J. Bodendorf et al., vol. 15, No. 2, pp. 656-657, (1972).
*IBM Technical Disclosure Bulletin*, "Forming Burried Layer by Diffusion," O. R. Viva et al., vol. 11, No. 10, pp. 1342-1343, (3/1969).
*IBM Technical Disclosure Bulletin*, "Integrated Circuit Chip Package," C. N. Liu et al., vol. 17, No. 7, p. 2018, (12/1974).

Primary Examiner—John Lee
Attorney, Agent, or Firm—John A. Fisher; Jeffrey Van Myers; David L. Mossman

[57] ABSTRACT

A mounting means for a semiconductor integrated circuit, the mounting means comprising a semiconductor material having a mounting surface as one major surface thereof, a semiconductor integrated circuit mounted on the major surface of the semiconductor material, and means for electrically connecting the integrated circuit to the semiconductor material. The mounting means has a coefficient of thermal expansion similar to the semiconductor integrated circuit mounted thereon.

21 Claims, 6 Drawing Figures

SEMICONDUCTOR PACKAGING AND METHOD

CROSS-REFERENCE TO A RELATED APPLICATION

This application is a continuation-in-part application of U.S. patent application Ser. No. 595,863 filed Apr. 2, 1984 (now abandoned).

FIELD OF THE INVENTION

This invention relates to the packaging or mounting of semiconductor devices, and more particularly to the packaging or mounting of large-scale integrated circuit devices.

BACKGROUND OF THE INVENTION

Most large-scale integrated circuits are presently packaged in plastic or ceramic packages with metal leads extended therefrom for soldering to a printed circuit board or for insertion into a socket. Typically, these IC packages are configured as dual-in-line or quad-in-line packages. In most instances only a single IC is contained within a package, although multiple chips are sometimes contained within a package. The circuit density resulting from this packaging technology is not very great, since the ceramic or plastic package consumes relatively large areas of the mounting surface, usually a printed circuit (PC) board, particularly if a socket is used.

A denser packaging technology is needed when mounting area or volume is limited or when speed considerations dictate that circuit elements be closely spaced. One such technology comprises the use of a ceramic substrate onto which ICs in an unpackaged form are directly attached to the ceramic mounting surface and are wire bonded to conductive areas on the mounting surface, or are inverted and connected directly to metallized areas on the ceramic mounting surface by, for example, a solder-pump technique. See, for examples, U.S. Pat. Nos. 3,927,815 to Mase, et al., 4,153,988 to Doo, 4,288,841 to Gogal and 4,549,200 to Ecker, et al. This technology, however, has several limitations. The ceramic material has a thermal coefficient of expansion different from that of the semiconductor material, and stresses on the mounting and bonding mechanisms occur. Also, interconnecting multiple ICs on a single ceramic mounting surface requires deposition of a metallic material in a pattern which desirably avoids cross-overs. Furthermore, the deposition of metallic conductors of extremely fine resolution is, on many surfaces, difficult. Additionally, if components, active or passive, are necessary to the circuit, discrete components must be used with their attendant problems of size and mounting mechanisms.

The thermal expansion coefficient mismatch between the integrated circuit chip and the mounting means or surface upon which IC chip is mounted has been addressed by others. For example, see C. N. Liu, et al. "Integrated Circuit Chip Package," *IBM Technical Disclosure Bulletin,* Vol. 17, No. 7, December 1974, p. 2018. In this package, the chips are not directly mounted onto the substrate, which has a different thermal expansion coefficient from the chips, but are supported above and cantilevered over the substrate by the means of rigid pedestals, which may undesirably consume excess vertical space.

Photocouplers provide additional examples of IC chips mounted on semiconductor substrates. For example, U.S. Pat. No. 4,122,479 to Sugawara, et al. discloses a gallium arsenide (GaAs) light emitting element mounted on a polysilicon light receiving element. While both structures are semiconductors, they are not necessarily thermally compatible. Indeed, the coefficient of thermal expansion for GaAs is over twice as much as that for silicon over normal operating temperatures including room temperature. The coefficient of thermal expansion can be expressed in one form as $(\Delta L)/(L\Delta T)$ in units of $K^{-1}$ where L is the length under consideration in any units, T is the temperature in degrees Kelvin (K). Throughout this discussion, the thermal expansion coefficients will have units of $10^{-6}K$. According to the M. Neuberger, *The Handbook of Electronic Materials,* IFI/Plenum, 1971, Vol. 5, Group IV Semiconducting Materials, p. 37 and Vol. 2, Group III-V Semiconducting Materials, p. 45, silicon has a thermal expansion coefficient of 1.44 at 200 K. and 2.44 at 300K., whereas GaAs has a coefficient of 6.86 at 211-473K. 6.0 at 300K. Thus, GaAs expands twice the amount of silicon when heated over this range. While this difference may not have much of an effect over a single, point bond, it will place stresses on bonds on opposite edges of a VLSI chip mounted n inverted fashion which may wear out and break the bonds over many heating and cooling cycles. If the entire chip is mounted device-side-up on a substrate, severe stresses over the entire width of the chip could possibly crack the chip. Similar structures are seen in U.S. Pat. Nos. 4,092,614 to Sakuma, et al., 4,143,385 to Miyoshi, et al. and Japanese patent document No. 56-161681 to Fujitsu, et al. which disclose semiconductor chips mounted on semiconductor substrates, but do not specify the nature of the semiconductor materials in most instances and do not discuss the importance of choosing materials substantially similar to each other with respect to their thermal expansion properties.

U.S. Pat. No. 4,450,472 to Tuckerman, et al. teaches a semiconductor chip having improved heat dissipation capability by means of coolant chambers and microscopic channels which includes a cover that may be of the same semiconductor material as the chip. However, this structure is not otherwise similar to assemblies where IC chips having active devices therein are mounted on substrates also having active devices fabricated therein.

U.S. Pat. No. 3,698,082 to Hyltin, et al. describes a method for fabricating an integrated circuit array supporting substrate having coaxial transmission lines formed about a core in proper position for electrically connecting IC chips. The patent notes that the supporting substrate may be a strip transmission line comprised of a sheet of high resistivity silicon, intrinsic gallium arsenide or other material having a high resistivity or insulating properites. However, thermal expansion coefficient matching is not discussed and the substrate therein is not noted as bearing active devices.

D. J. Bodendorf, et al. in "Active Silicon Chip Carrier," *IBM Technical Disclosure Bulletin,* Vol. 15, No. 2, July 1972, p. 656 describe a silicon carrier substrate having silicon chips mounted thereon in "flip-chip" or inverted fashion. However, the chips are separated from the actual silicon substrate by interconnect and insulative layers. In addition, the silicon chips are described as mounted directly over the bipolar devices fabricated in the silicon carrier substrate risking possible damage to the underlying bipolar devices during the bonding of the silicon chips.

It is an object of the instant invention to provide an improved mounting surface for semiconductor devices.

It is a further object of the invention to overcome the thermal expansion problems of ceramic mounting materials of different composition for the integrated circuit.

It is another object of the invention to provide a mechanism for incorporating off-chip elements, active or passive, in a layout-efficient manner.

It is an additional object of the invention to provide a layout-efficient mechanism for interconnecting multiple ICs on a single mounting substrate.

It is another object of the invention to provide an IC mounting surface which may be used to fabricate semiconductor components which may be interconnected or connected to the integrated circuits mounted thereon.

Another object of the invention is to provide a means for increasing the density of integrated devices without placing chips on tops of devices formed in the substrate.

SUMMARY OF THE INVENTION

In carrying out these and other objects of the invention, there is provided, in one form, a mounting means for a semiconductor integrated circuit, the mounting means comprising a semiconductor material having a mounting surface as one major surface thereof for directly supporting a semiconductor integrated circuit mounted thereon, wherein the semiconductor material of the mounting means and the semiconductor integrated circuit have substantially similar thermal expansion properties. Selected regions in the substrate have impurity concentrations higher than the impurity concentrations in the remainder of the substrate so that the selected region of higher impurity concentration is conductive and thereby a portion of an active or passive element. An active element may be a transistor, such as a field effect transistor, a bipolar transistor, a driver transistor, a power transistor, an output transistor, a voltage regulating transistor, etc. A passive device may be a wiring connection, a resistor, etc. In addition, means for electrically connecting the integrated circuit to the semiconductor material is also present.

DETAILED DESCRIPTION OF THE INVENTION

Figure 1:
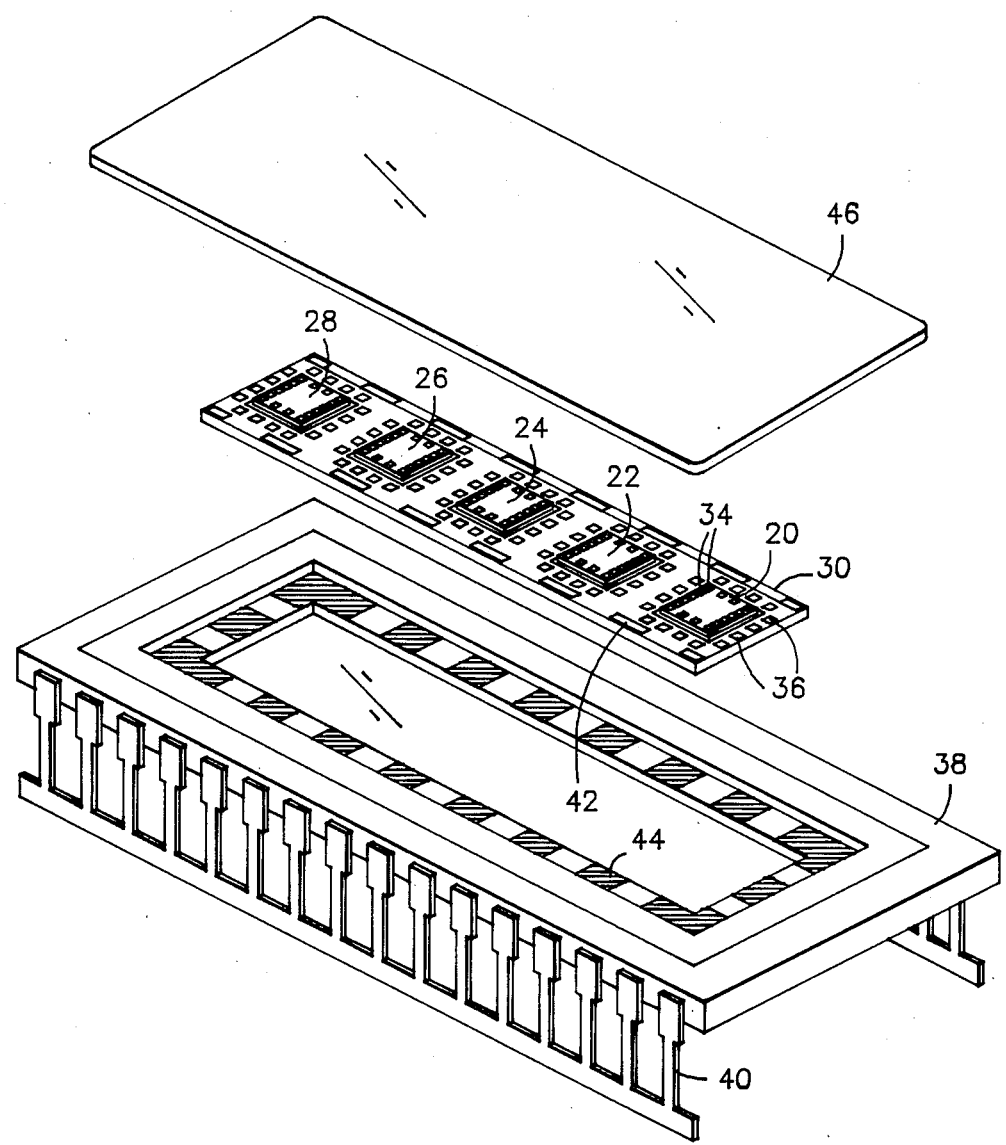
FIG. 1 is a semiconductor packaging system according to the invention.
Figure 4:
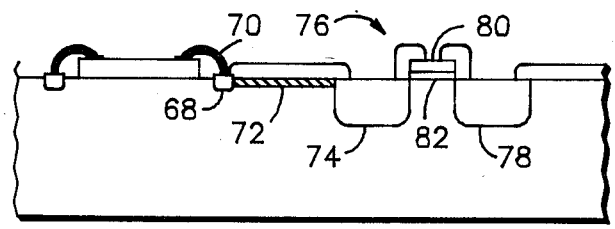
FIG. 4 shows a side view of a mounting surface and an integrated circuit where the mounting surface includes a connection to an active element via a diffused cross-under.

FIG. 1 shows a semiconductor packaging system in which a plurality of semiconductor devices or chips, which may be, for example, large-scale integrated circuit devices 20, 22, 24, 26, 28 are mounted upon a mounting surface 30 which is fabricated of semiconductive material, such as silicon, gallium arsenide, or other semiconductive material. The semiconductor chips have input/output electrical connectors in the form of bonding pads 34 from which the chips may be connected to bonding pads 36 on the mounting surface 30. Typically the chip pads would be bonded to the mounting surface pads by small thin-diameter wires 70 which may be of gold, aluminum or silver, or an alloy of either gold, aluminum, or silver; or by any other conductive means as will be described and as shown in FIG. 4.

The chips are mechanically bonded to the mounting surface 30 by solder, eutectic bonding, epoxy cement or any other suitable means. Directly mounting the chips to the mounting surface 30 and choosing the semiconductor materials of the chips and the surface 30 so that they are substantially similar to each other with respect to their thermal expansion properties ensures that the assembly of chips on surface 30 will not be unduly stressed or have connections broken during repeated heating and cooling cycles. To say that the coefficients of thermal expansion for the chips and the mounting surface are "substantially similar" is to say that there is no appreciable difference between them, or the difference between coefficients that exists is negligible for this purpose.

Since the mounting means is semiconductive material, conventional semiconductor interconnection techniques may be used to efficiently interconnect the electrical bonding pads 36 on the mounting surface, to connect the pads 36 to a package 38 into which the mounting means 30 may be placed or to a lead frame for disposition in a package on another carrier, to additional circuit elements in the mounting surface external to the chips, or to connect to other circuit elements mounted on the mounting means. Electrical contact between the mounting means 30 and the leads 40 of the package 38, may be by means of conductive areas 42 which are connected to one or more of the mounting surface pads 36, and which come into contact with conductive areas 44 of the package, which, in turn, are electrically connected to external leads 40 of the package. Other conventional techniques such as wire bonding, "flip-chip" style bump bonding or thin, flexible tape automated bonding (TAB) frames may also be used. The leads 40 of the package may be used for insertion into a socket on a PC board (not shown) or for soldering or otherwise connecting the package to other circuit elements on the PC board. A lid 46 is appropriately physically attached to the package 38 to provide a seal, which may be hermetic, to enclose the mounting means and integrated circuits.

Figure 2:
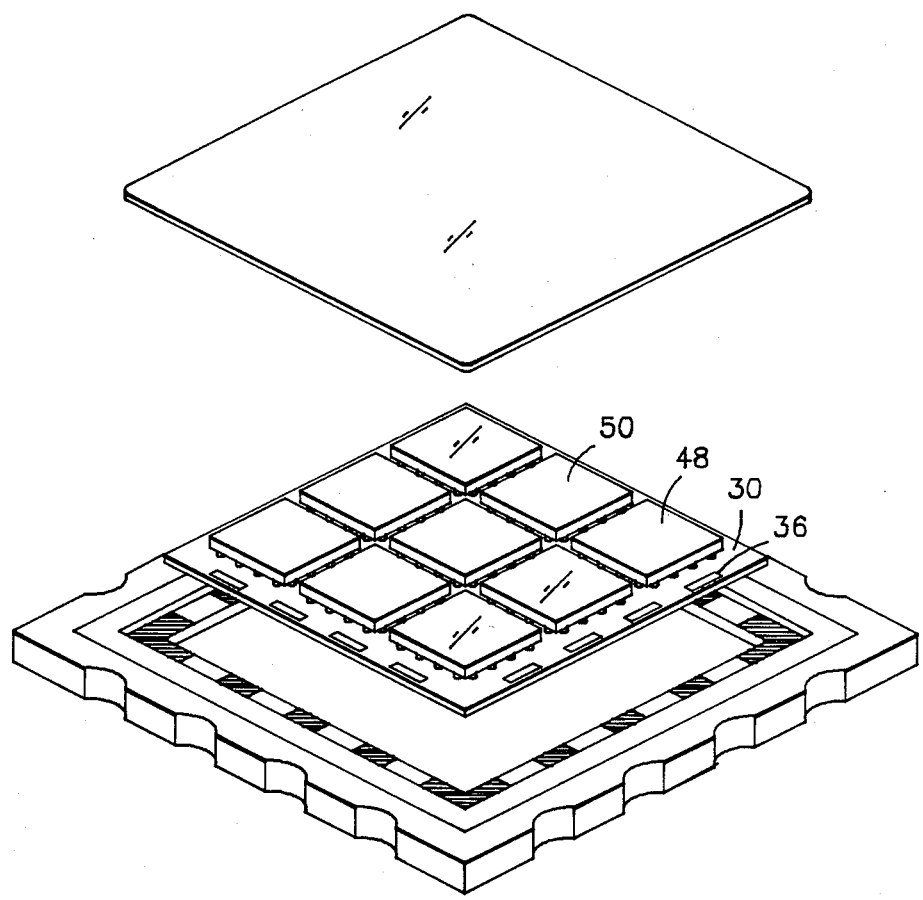
FIG. 2 is a semiconductor packaging system showing an alternative mounting technique.

FIG. 2 shows a similar mounting arrangement for a plurality of semiconductors 48 and 50. The mounting means 30 is a semiconductive material as discussed with respect to FIG. 1. FIG. 2 is intended to show a somewhat different mounting technique wherein the semiconductors 48 and 50 are mounted in an inverted fashion, i.e. with the surfaces thereof containing the circuitry and bonding pads oriented toward the bonding pads of the mounting surface. The chips are attached to the surface of the mounting means 30 by a "solder bump" method or similar method, well known in the art. Again, as in FIG. 1, since the mounting means is a semiconductive material, semiconductor interconnection techniques may be employed in connecting various of the bonding pads to each other, to package connection terminals 36 or to other active or passive circuit elements external to the chips.

In mounting the semiconductor by the solder-bump method, the mounting surface may be prepared by depositing in any convenient manner a conductive pad opposite the location of the semiconductor bonding pad. Alternatively, doped conductive regions 51 may be provided in the mounting surface opposite the mounting pads and the chip may be bonded directly to the surface over the doped region.

Figure 3:
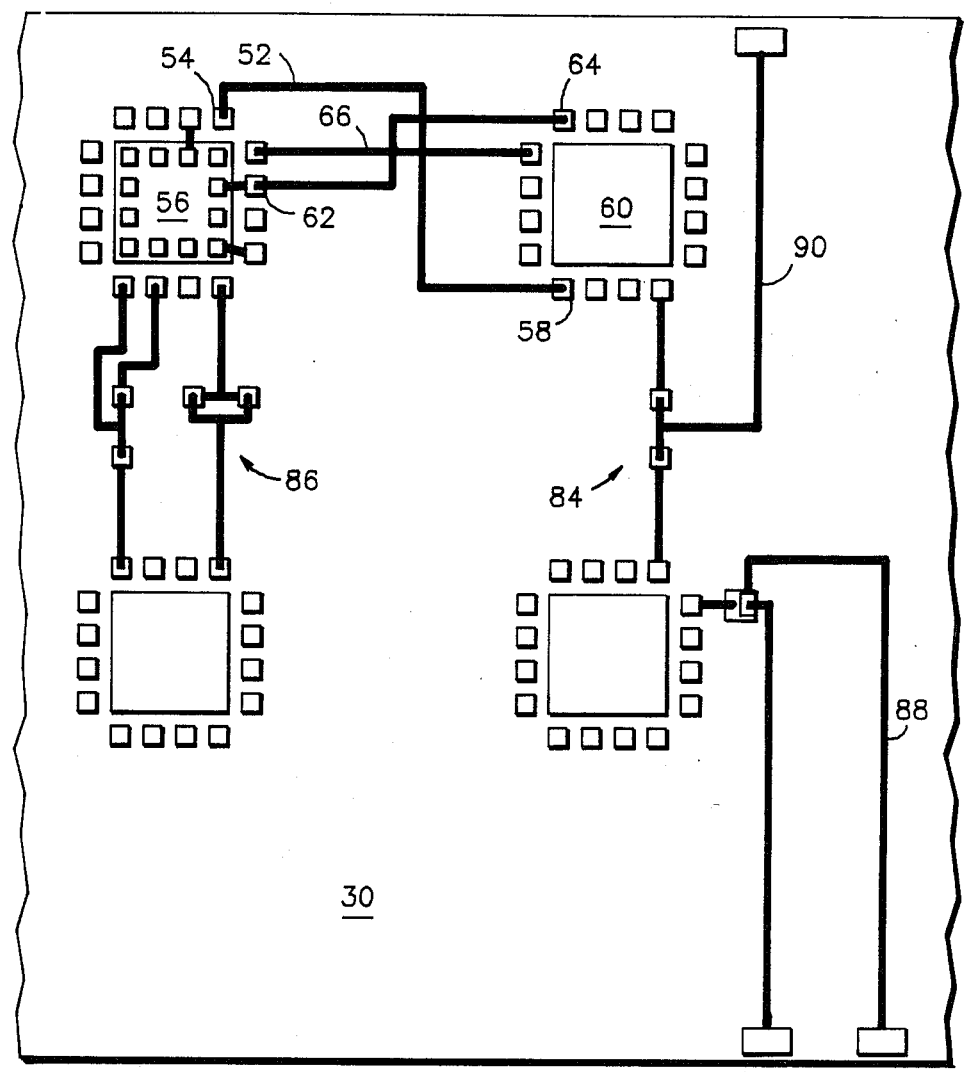
FIG. 3 shows a semiconductor mounting surface with chip sites and interconnects in conductive layers and as doped semiconductor regions, together with active and passive devices fabricated in the semiconductor mounting surface.

FIG. 3 shows a top view of a mounting surface 30 with a plurality of semiconductor devices mounted thereon. This Figure discloses the chip interconnection flexibility made available by the use of a semiconductive material as a mounting substrate. Shown at 52 is an interconnection between a bonding pad 54 of one chip 56 and a bonding pad 58 of a second chip 60 wherein the interconnection is a conductor of doped polysilicon, formed by depositing doped polysilicon directly or by depositing undoped polysilicon and subsequently doping as required to the appropriate level of conductivity. Resistive elements may be formed in this manner by variable doping of the polysilicon, for example, as well as by other conventional techniques. Also shown in FIG. 3 is an interconnection between a pad 62 of chip 56 and a pad 64 of chip 60 which is formed by the diffusion, implantation, or other dopant application method of a dopant of opposite conductivity type as that of the mounting substrate 30. Such a technique may also be employed to form crossunders, whereby two or more layers of conductive or semiconductive material may cross in order to ease the problems associated with layout of complex circuits. This technique also may be particularly useful in those applications requiring IC packages with extremely large pin counts, for example, those requiring in excess of 100 pins.

Further shown in FIG. 3 is an interconnection of deposited aluminum 66, as may also be used in conventional PC technology. In the instant invention, many conventional printed circuit techniques remain available, and additionally certain semiconductor processing techniques also become available to provide extreme flexibility in layout and size reduction as well as the advantages which obtain from using temperature characteristic-compatible materials as mounting substrates for integrated circuits. Of course, for any particular design or application one or more of the advantages may be the dominant consideration.

Another feature of the invention is the availability of the mounting means as a separate substrate for the fabrication, by conventional techniques, of semiconductor devices such as field effect transistors, bipolar transistors, capacitors, resistors, diffused contact areas, display devices, heat management devices or the like.

As shown in FIG. 3, the bonding pads or other elements may be brought to the edges of the mounting substrate for connection to a package as shown in FIG. 1 by any of the routing techniques noted above. Additionally, numerous deeply implanted or diffused areas may be formed for connection to the numerous pins of VLSI system packages.

A plurality of field effect transistors 84, 86 are also shown schematically in FIG. 3, as are the diffusion or other conductive paths 88 and 90 from the chips or other circuit elements to the edge of the mounting surface.

FIG. 4 shows a cutaway view of a portion of the mounting surface of FIG. 3 with one of the chips thereon. The chip is shown mounted with the bonding pads upward and bonding to the mounting surface with thin metal wires 70, usually gold, aluminum, or a gold alloy. A diffused area 68 is shown under the mounting surface with provides electrical connection to the semiconductive mounting material. A diffused area 72 is shown contiguous to the diffusion 68 which serves as a conductive path to the drain 74 of a field effect transistor 76. Of course, while a field effect transistor is shown, a bipolar transistor could easily be formed by conventional techniques. The source of the transistor 76 is shown at 78, and the gate is shown at 80, overlying a thin insulating layer. 82. Electrical connections to each of the transistor electrodes may be made by conventional means.

Figure 5:
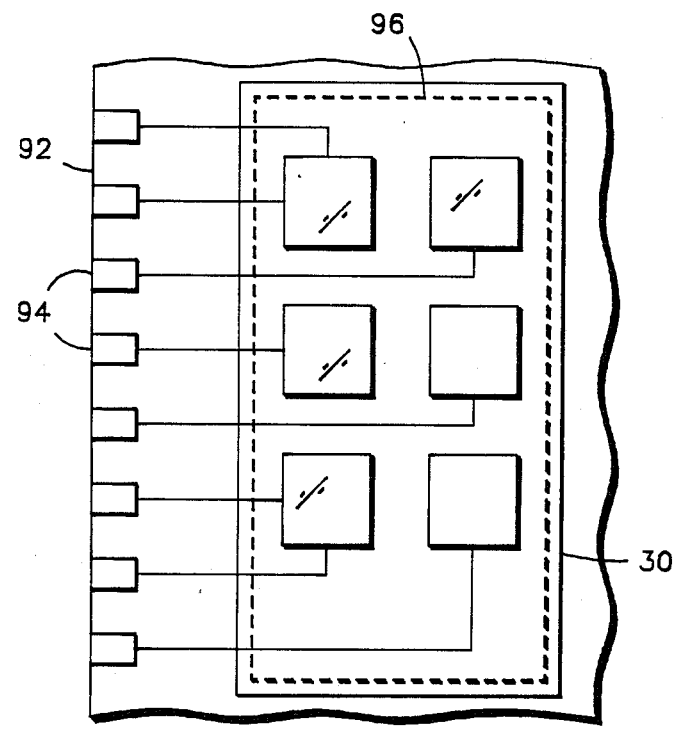
FIG. 5 shows a plurality of integrated circuits mounted on a semiconductor mounting surface configured with edge connections.

FIG. 5 shows a mounting substrate where all of the leads are brought out to one edge 92 of the substrate to conductive connectors 94 which may have a deposited gold coating. This allows the mounting substrate to be plugged directly in a motherboard or other socket in lieu of mounting the mounting surface in a package. The portion of the mounting substrate 96 containing semiconductor chips may be encapasulated in a suitable potting material, or may be otherwise packaged.

Figure 6:
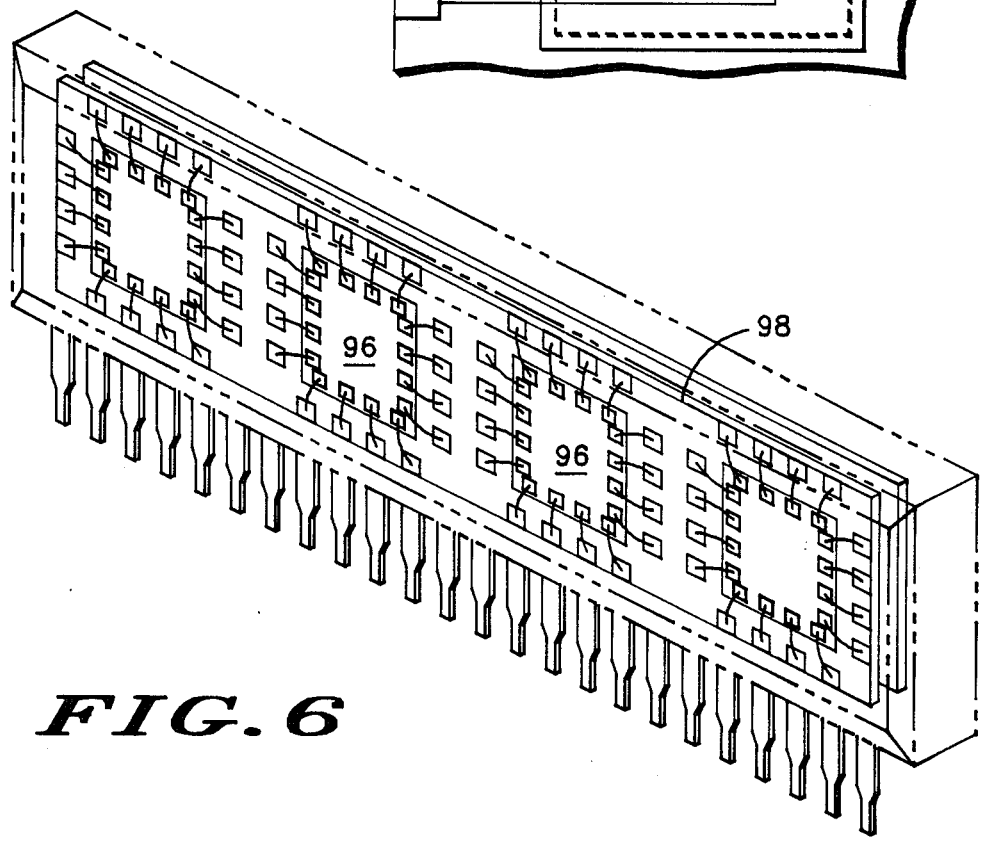
FIG. 6 shows a plurality of integrated circuits mounted on a semiconductor mounting surface configured for use as a single-in-line package.

FIG. 6 shows a plurality of integrated circuits mounted on a semiconductor mounting surface and configured as a single-in-line package. Memory devices for example, may be mounted in this fashion with the required decoupling capacitors or other circuit elements fabricated into the mounting surface 98. Integral decoupling capacitors are a known concept, of course; see, for example, O. R. Viva, et al. "Forming Buried Layers by Diffusion," *IBM Technical Disclosure Bulletin,* Vol. 11. No. 10, March 1969, p. 1342. A solar cell may also be fabricated into the semiconductor mounting surface to provide power to the IC devices formed thereon and to the devices in the chips or die mounted thereon. Fabricating solar cells in a silicon substrate is also well-known in the art, see for instance U.S. Pat. No. 4,517,403 to Morel, et al. The devices shown are then encapsulated in plastic.

The Figures, particularly FIG. 4 demonstrate the planar nature of the mounting means assembly of the present invention. The integrated circuit chip devices of chips 56 and 60 are oriented laterally and not vertically with respect to the devices fabricated in the mounting surface 30. While stacking devices to increase device density has long been a goal in the industry, it has been very difficult to accomplish in actual fact. To mount chips directly over formed devices as in D. J. Bodendorf, et al. in "Active Silicon Chip Carrier," *IBM Tech. Disc. Bull.,* Vol. 15, No. 2, p. 656 runs the risk of damaging the underlying devices. Such a structure also limits one to a procedure of finishing the processing of the semiconductor substrate before mounting the chips. With the instant structure, further processing of the mounting means, such as forming passivation layers or even device formation can be performed after the IC chips are bonded to the substrate.

I claim:

1. A mounting means for supporting a semiconductor integrated circuit comprising:
   a substrate of semiconductive material, having a surface for directly supporting a semiconductor integrated circuit, wherein the semiconductive material of the substrate and the semiconductor integrated circuit have substantially similar thermal expansion properties and may be processed in a substantially similar way to fabricate electrical elements therein,
   an electrical element in the substrate, which element is selected from the group of elements consisting of active elements and passive elements,
   a selected region in the substrate having an impurity concentration higher than the impurity concentration in the remainder of the substrate so that the selected region of higher impurity concentration is a portion of the electrical element, and
   means for electrically coupling the integrated circuit to the region of the substrate of higher impurity concentration.

2. A mounting means as set forth in claim 1 wherein the electrical element is a field effect transistor.

3. A mounting means as set forth in claim 1 wherein the integrated circuit and substrate are encapsulated in a package and the selected region of higher impurity concentration couples the integrated circuit to a conductive lead of the package.

4. A mounting means as set forth in claim 1 wherein the means for electrically coupling the integrated circuit to the region of the substrate of higher impurity concentration is selected from the group of coupling means consisting of wire bonding, "flip-chip" bump bonding and tape automated bonding (TAB).

5. A mounting means for an integrated circuit comprising a supporting surface of a semiconductor material substantially similar to the semiconductor material from which the integrated circuit is fabricated with respect to their thermal expansion properties and the processes that may be used to fabricate electrical elements therein, and upon which the integrated circuit is to be directly mounted, and wherein the surface has fabricated therein an electrical element by selective doping of the supporting surface material; and means for electrically coupling the integrated circuit to the mounting means.

6. A mounting means as set forth in claim 5 wherein the integrated circuit and the supporting surface are both fabricated from monocrystalline silicon.

7. A mounting means as set forth in claim 6 wherein the electrical element is a bipolar transistor.

8. A mounting means as set forth in claim 6 wherein the electrical element is a field-effect transistor.

9. A mounting means as set forth in claim 5 wherein the electrical element is a transistor.

10. A mounting means as set forth in claim 9 wherein the transistor is a bipolar transistor.

11. A mounting means as set forth in claim 9 wherein the transistor is a field effect transistor.

12. A mounting means as set forth in claim 5 wherein the electrical element is a solar collector and the solar collector provides voltage to the integrated circuit 13. A mounting means as set forth in claim 5 wherein the surface has fabricated therein an electrical circuit.

14. A mounting means as set forth in claim 13 wherein the electrical circuit provides an input to the integrated circuit.

15. A mounting means as set forth in claim 13 wherein the electrical circuit accepts an output signal from the integrated circuit.

16. A mounting means as set forth in claim 5 wherein the electrical element is selected from the group of electrical elements consisting of active and passive elements, and comprises a conductor.

17. A mounting means as set forth in claim 5 wherein the means for electrically coupling the integrated circuit to the electrical element fabricated by selective doping of the supporting surface material is selected from the group of coupling means consisting of wire bonding, "flip-chip" bump bonding and tape automated bonding (TAB).

18. A mounting means for supporting a semiconductor integrated circuit in a substantially planar orientation comprising:
   a substrate of semiconductive material, having a surface for directly supporting a semiconductor integrated circuit, wherein the semiconductive material of the substrate and the semiconductor integrated circuit have substantially similar thermal expansion properties and may be processed in a substantially similar way to fabricate electrical elements therein,
   a selected region in the substrate having an impurity concentration higher than the impurity concentration in the remainder of the substrate so that the selected region of higher impurity concentration is electrically conductive relative to the remainder of the substrate, said selective region of higher impurity concentration residing beyond the area of semiconductive substrate upon which the integrated circuit is to be mounted, and
   means for electrically coupling the integrated circuit to the region of the substrate of higher impurity concentration.

19. A mounting means for supporting a semiconductor integrated circuit comprising:
   a substrate of silicon, having a surface for directly supporting a silicon integrated circuit, wherein the silicon of the substrate and the silicon integrated circuit have substantially similar thermal expansion properties and may be processed in a substantially similar way to fabricate electrical elements therein,
   a selected region in the substrate having an impurity concentration higher than the impurity concentration in the remainder of the substrate so that the selected region of higher impurity concentration is electrically conductive relative to the remainder of the substrate, and
   a plurality of wire bond pads for electrically coupling the integrated circuit to the region of the substrate of higher impurity concentration.

20. An integrated circuit assembly comprising:
   a mounting surface for supporting a semiconductor integrated circuit comprising:
      a substrate of semiconductive material, having a support surface for directly supporting a semiconductor integrated circuit, wherein the semiconductive material of the substrate and the semiconductor integrated circuit have substantially similar thermal expansion properties and may be processed in a substantially similar way to fabricate electrical elements therein,
      an electrical element in the substrate, which element is selected from the group of elements consisting of active elements and passive elements, and a selected region in the substrate having an impurity concentration higher than the impurity concentration in the remainder of the substrate so that the selected region of higher impurity concentration is a portion of the electrical element, a plurality of semiconductor integrated circuits mounted on the region of the substrate of higher impurity concentration; and means for electrically coupling the integrated circuits to the region of the substrate of higher impurity concentration.

21. An integrated circuit assembly as set forth in claim 20 wherein the means for electrically coupling the plurality of integrated circuits to the region of the substrate of higher impurity concentration is selected from the group of coupling means consisting of wire bonding, "flip-chip" bump bonding and tape automated bonding (TAB).

* * * * *